(12) United States Patent
Werner et al.

(10) Patent No.: US 7,932,737 B2
(45) Date of Patent: Apr. 26, 2011

(54) PROBER FOR TESTING DEVICES IN A REPEAT STRUCTURE ON A SUBSTRATE

(75) Inventors: Frank-Michael Werner, Dresden (DE); Matthias Zieger, Riesa (DE); Sebastian Giessmann, Wildenhain (DE)

(73) Assignee: Cascade Microtech, Inc., Beaverton, OR (US)

( * ) Notice: Subject to any disclaimer, the term of this patent is extended or adjusted under 35 U.S.C. 154(b) by 143 days.

(21) Appl. No.: 12/345,980

(22) Filed: Dec. 30, 2008

(65) Prior Publication Data

US 2009/0179658 A1 Jul. 16, 2009

(30) Foreign Application Priority Data

Jan. 10, 2008 (DE) .......................... 10 2008 003 754

(51) Int. Cl.
*G01R 31/00* (2006.01)
(52) U.S. Cl. ......... 324/756.03; 324/750.16; 324/750.19; 324/756.02

(58) Field of Classification Search ........................ None
See application file for complete search history.

(56) References Cited

U.S. PATENT DOCUMENTS

| 6,435,045 | B1 * | 8/2002 | Chen et al. | .................... | 73/866.5 |
| 7,436,171 | B2 * | 10/2008 | Lou et al. | .................... | 324/158.1 |
| 7,642,800 | B2 * | 1/2010 | Ku et al. | ...................... | 324/765 |

\* cited by examiner

*Primary Examiner* — Roberto Velez
(74) *Attorney, Agent, or Firm* — Chernoff, Vilhauer, McClung & Stenzel

(57) ABSTRACT

A prober for testing devices in a repeat structure on a substrate is provided with a probe holder plate, probe holders mounted on the plate, and a test probe associated with each holder. Each test probe is displaceable via a manipulator connected to a probe holder, and a substrate carrier fixedly supports the substrate. Testing of devices, which are situated in a repeat structure on a substrate, in sequence without a substrate movement and avoiding individual manipulation of the test probes in relation to the contact islands on the devices, is achieved in that the probe holders are fastened on a shared probe holder plate and the probe holder plate is moved in relation to the test substrate.

9 Claims, 5 Drawing Sheets

PROBER FOR TESTING DEVICES IN A REPEAT STRUCTURE ON A SUBSTRATE

CROSS REFERENCE TO RELATED APPLICATIONS

This application claims priority of German application No. 10 2008 003 754.0 filed on Jan. 10, 2008, the entire disclosure of this application is being hereby incorporated herein by reference.

Background Art

The invention relates to a prober for testing devices in a repeat structure on a substrate having a probe holder plate, probe holders, on which a test probe is situated, which are each displaceable via a manipulator connected to a probe holder, and a substrate carrier on which the substrate may be fixed.

The invention also relates to a method for testing devices in a repeat structure on a substrate, in which needle tips of test probes are each positioned using a manipulator on a probe holder in relation to test contacts on the device, one first device is tested, and subsequently the test probes are positioned in relation to test contacts on a second device and the second device is tested.

Probers and methods for testing devices, which have a lower frame, over which a probe holder plate is situated at a distance to accommodate test probes, which contact the devices to be tested, are known. A movement unit is connected to the frame, on which a substrate carrier is situated within the distance spacing between frame and probe holder plate. The probe holder plate is provided with an opening, below which the substrate carrier is implemented as movable.

Probers of this type are used for testing devices, such as semiconductor chips in the wafer composite. The semiconductor wafers are laid on the substrate carrier and clamped fixed on the substrate carrier The semiconductor wafers thus clamped are tested chip by chip in that contact islands located on the chip are contacted and impinged using measuring signals and the reaction to these measuring signals is measured or established. Test probes are provided for contacting the contact islands. These test probes are pre-mounted before the actual test procedure. The test probes are implemented in the form of test needles having associated needle carriers, which are then clamped fixed at one end in probe holders. The probe holders are then mounted on the probe holder plate in such a way that the needle tips of the test probes engage through the opening in the probe holder plate in the pattern of the contact islands on a semiconductor chip to be tested.

The intended purpose and the construction of the probers also further differ. Thus, for example, so-called vacuum probers are known, in which the testing of the devices occurs in a vacuum environment. Furthermore, subjecting the devices to be tested to specific thermal conditions is known, for example, heating them up during testing. For this purpose, the substrate carrier is equipped with a special cooling unit, which allows low temperatures or ultralow temperatures to be applied.

These known probers are used to test a plurality of different devices, such as semiconductor chips or so-called MEMs (micromechanical devices), such as sensors. In addition, it is also possible to subject the substrate to a strong magnetic field, magnetic cores, which are powered by a superconductive coil, being situated in proximity to the substrate.

For ultralow temperature probers, which permit testing of devices on the substrate in temperature ranges of 4 K, for example, the substrate carrier is cooled by a liquid gas source, in particular from a helium tank. The relatively low vaporization temperature of helium requires on the one hand that short liquid gas lines be provided, because otherwise the helium heats up so much in long lines that it vaporizes. In addition, it is hardly possible to provide a connection line which is flexible at these temperatures. In particular when supplying the superconductor in magnetization units, fixed piping is necessary between the liquid gas tank and the magnetization unit, but also between the liquid tank and the substrate carrier This proscribes mobility of the substrate carrier.

If devices are to be tested on a substrate, which are situated thereon in a repeat structure, which particularly all have the same contact island topography, it is necessary to manipulate the test probes from one device to the next again.

For this purpose, in a known prober from Lake Shore Cryotronics Inc., Ohio, having the name VFTT P4 Probe Station, the probe holders, which are provided with manipulators adjustable in the X, Y, and Z directions or are situated on corresponding cross tables, are to be situated outside the vacuum chamber and the test probes are to be inserted through folded bellows into the vacuum chamber and are to be positioned therein on the contact islands of the devices. The manipulation which is required again upon each approach to a new device to be tested is made easier. However, it has been shown that the folded bellows also exerts restoring forces on the test probes, and the temperature differences between chamber interior and chamber exterior strongly strain the test probes. This has the result that the positioning of the needle tips of the test probes on the devices does not have long-term stability.

In contrast, in a known cryoprober of the applicant having the name PMC 150, the probe holders together with their manipulators are situated inside the vacuum chamber. The manipulators are displaced via rotating shafts having universal joints, which are led to the outside, to adjust the test probes. This has the advantage that only three rotary bushings (one for each movement direction) are to be provided to the vacuum chamber wall per manipulator, and otherwise the movement of the test probes occurs in the interior of the vacuum chamber.

Although this prober results in long-term stability of the positioning, it does not overcome the disadvantage that upon testing of a new device, all test probes are to be adjusted to the new device.

BRIEF SUMMARY OF INVENTION

The invention is thus based on the object of testing devices, which are situated having a repeat structure on a substrate, in sequence without a substrate movement and avoiding individual manipulation of the test probes in relation to the contact islands on the devices at the same time.

The object is achieved by a prober having the features of Claim 1. Claims 2 through 8 disclose designs of the prober according to the invention.

The object is also achieved by a method having the features of Claim 9.

BRIEF DESCRIPTION OF THE DRAWING FIGURES

The invention is explained in greater detail hereafter on the basis of an exemplary embodiment. In the associated figures of the drawings.

DETAILED DESCRIPTION

Figure 1:
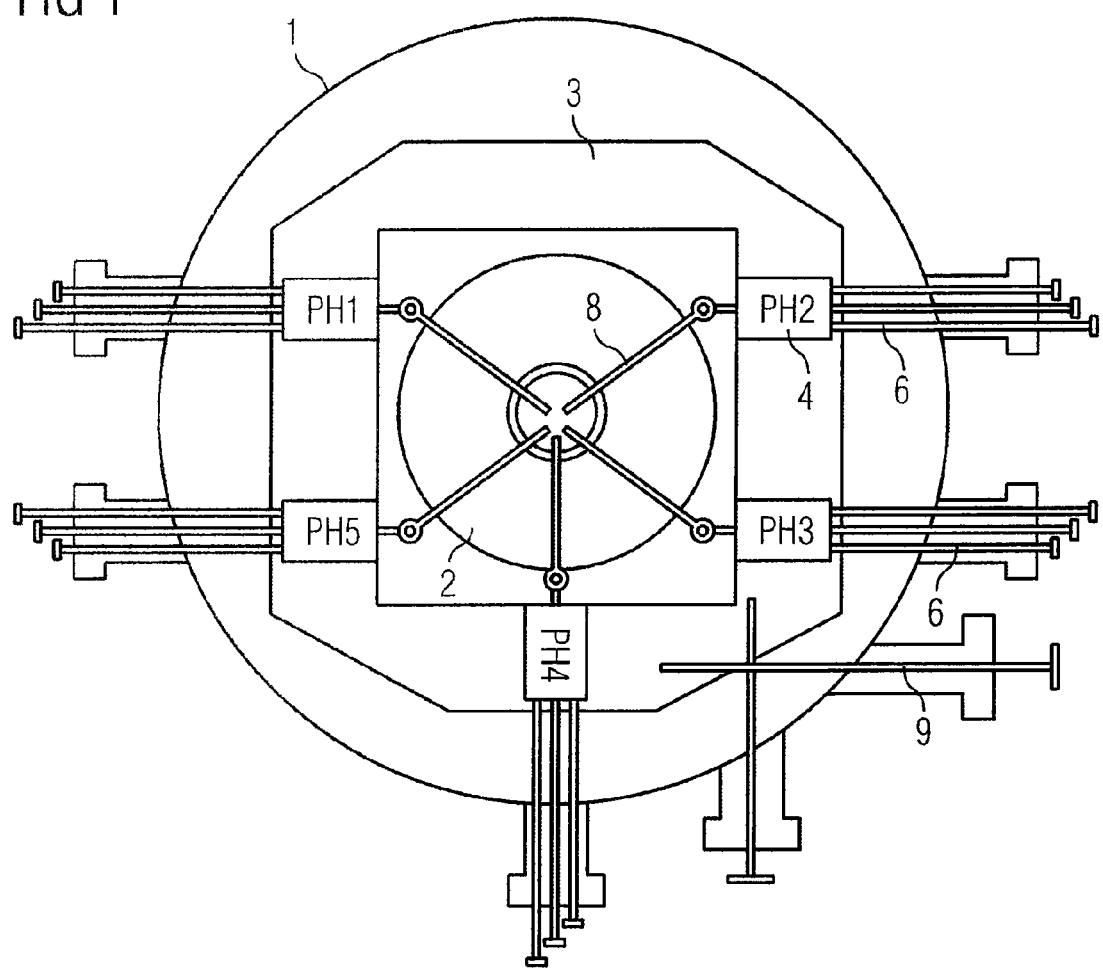
FIG. 1 shows a schematic illustration of a prober according to the invention in a vacuum chamber having mechanical displacement shafts in a middle position of the test probes in relation to the substrate.
Figure 2:
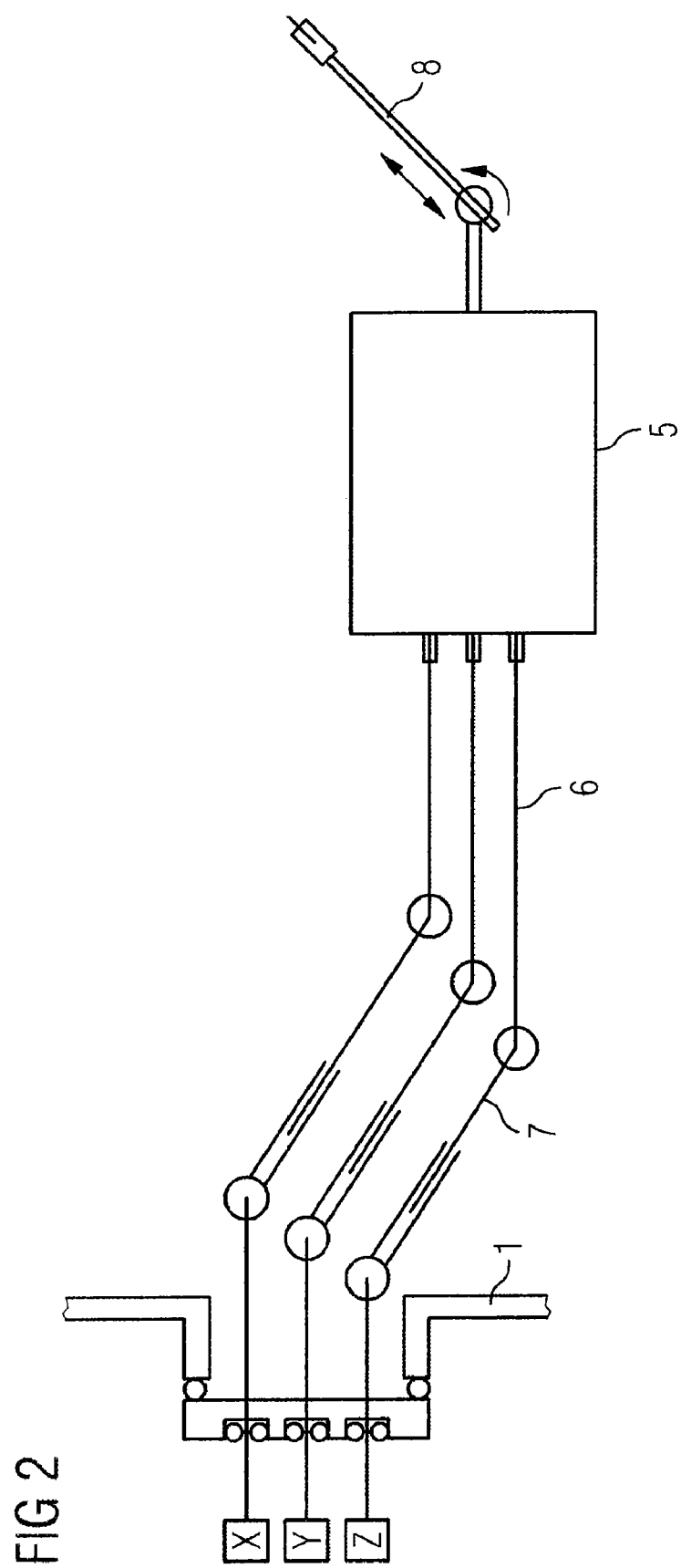
FIG. 2 shows a detail illustration of the mechanical displacement in interaction with the manipulator.

A fixed sample carrier 2 is situated inside a vacuum chamber 1. A probe holder plate 3 is situated above the sample carrier 2. Probe holders 4, which are provided with manipulators 5, may be laid and locked on this probe holder plate 3. As shown in FIGS. 1 through 4, displacement shafts 6, which have universal joints 7 and are guided through the vacuum chamber 1, are attached to the manipulators 5. Test probes 8 may thus be adjusted in relation to one another in such a way that they touch the contact surfaces (not shown) on the devices of the test substrate.

Figure 5:
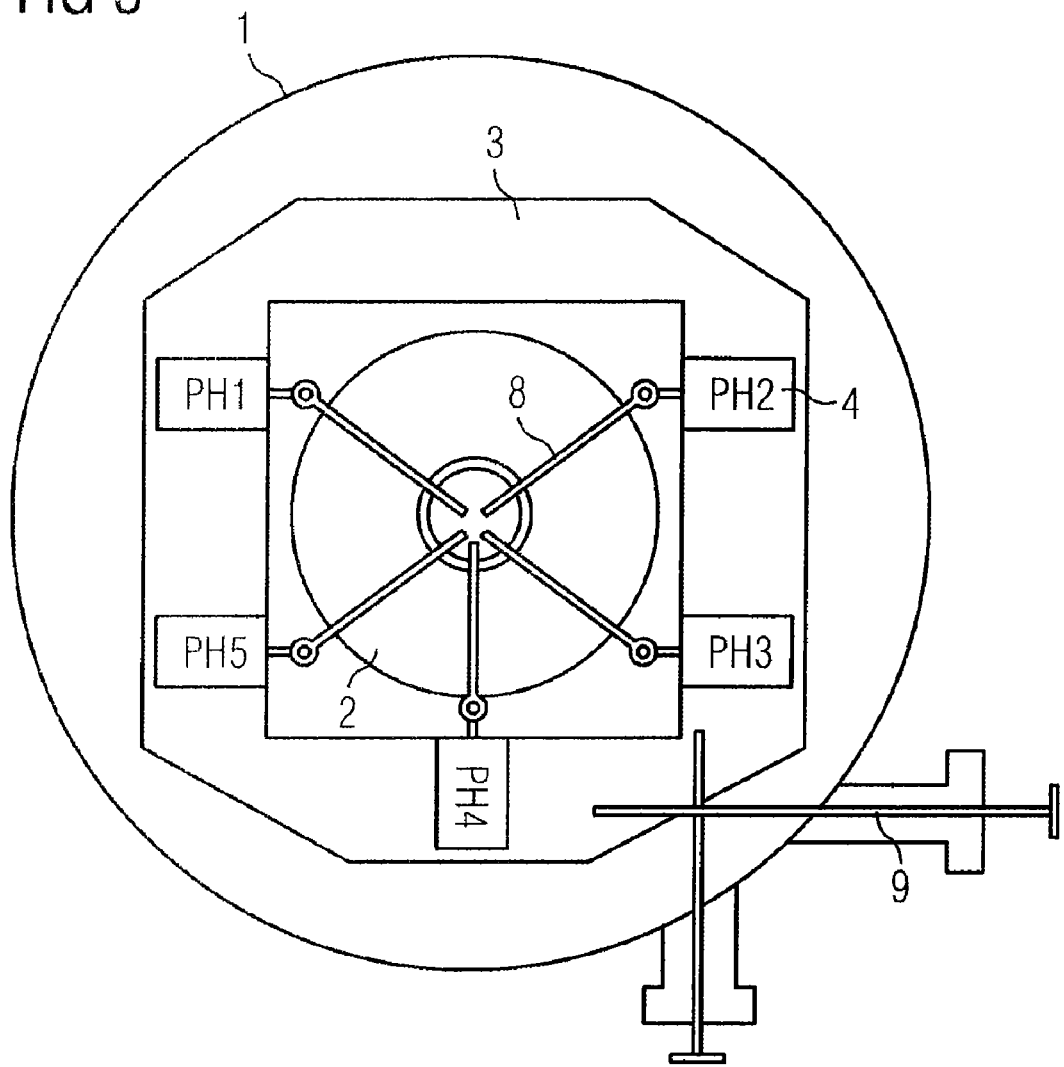
" and FIG. 5 shows a schematic illustration of a prober according to the invention in a vacuum chamber having electrically displaceable manipulators.

In FIG. 5, this setting is performed via motorized, in particular electro-motorized displaceable manipulators 5, so that a bushing through the wall of the vacuum chamber 1 may be dispensed with.

Figure 3:
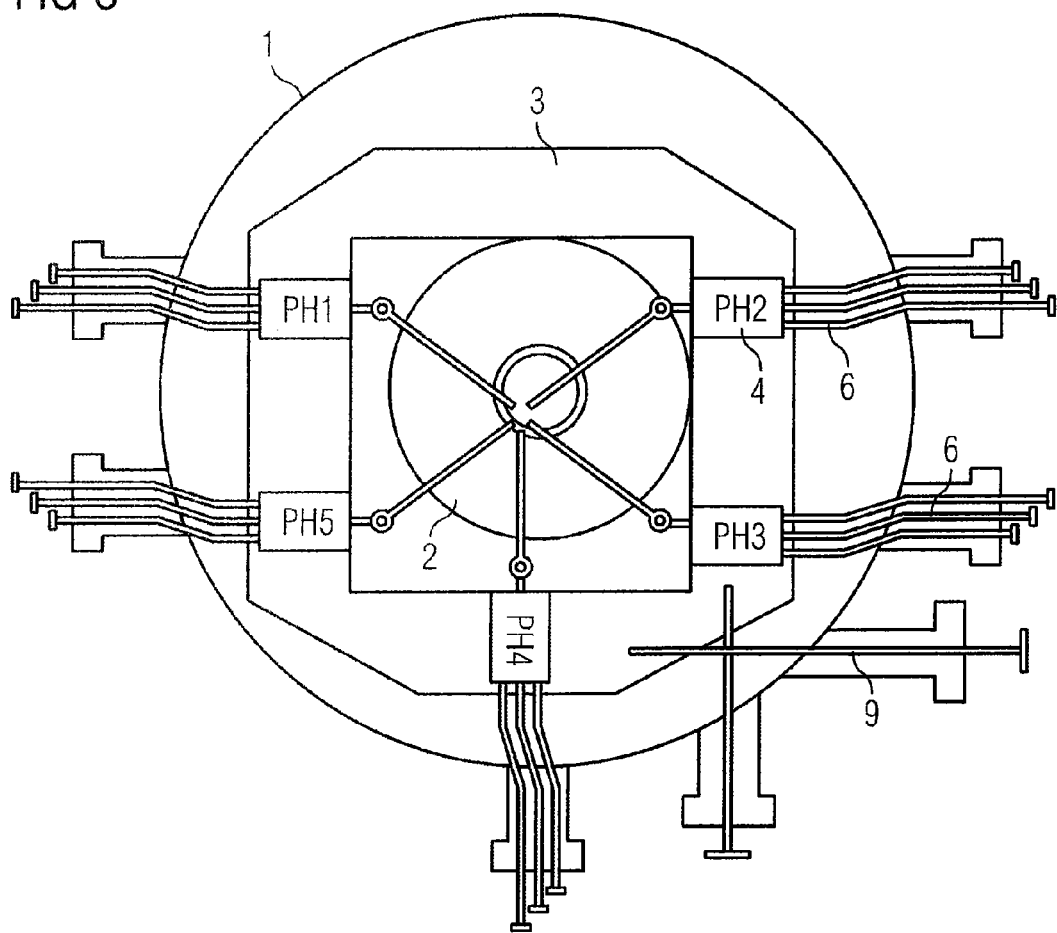
FIG. 3 shows the prober according to FIG. 1 in a first position shifted to the "southwest,"
Figure 4:
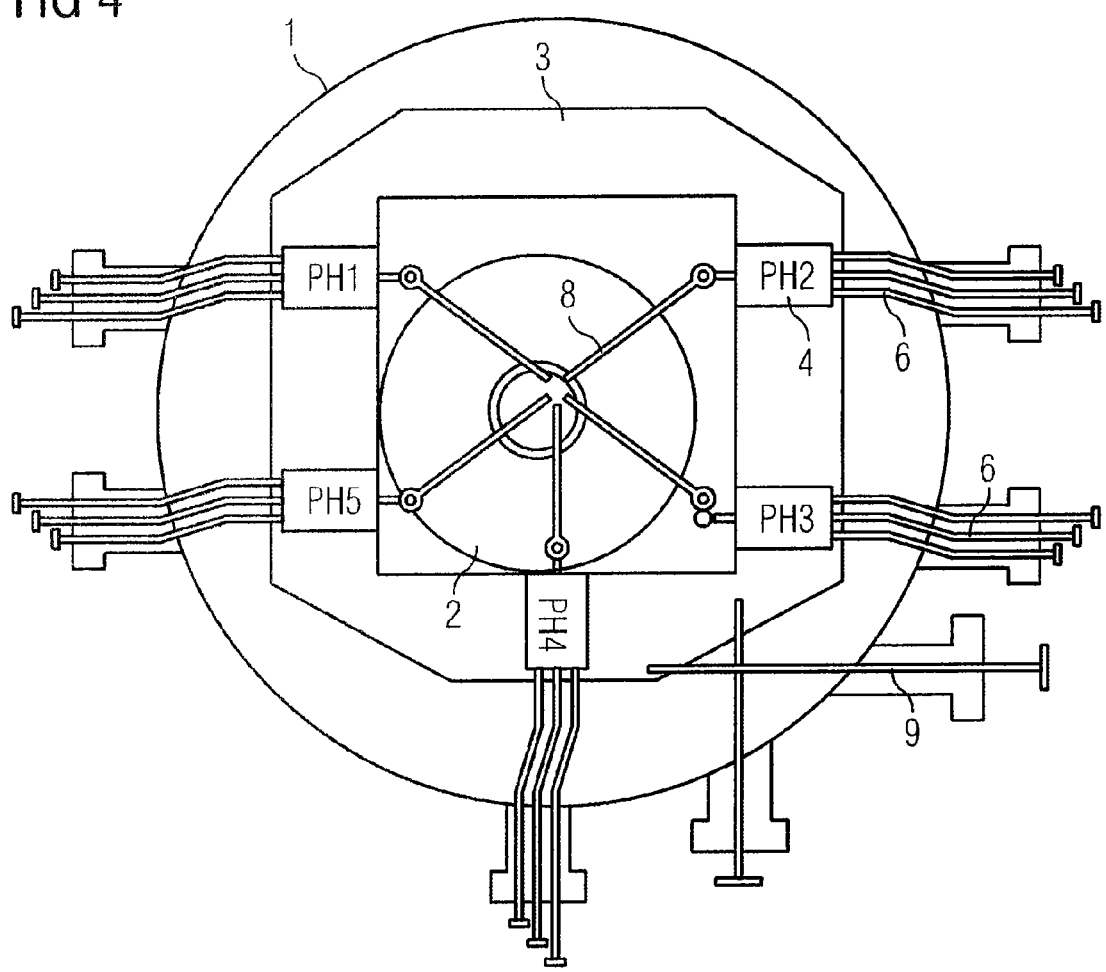
FIG. 4 shows the prober according to FIG. 1 in a first position shifted to the "northwest.

The probe holder plate 3 is displaceable in the X and Y directions, and with it also the probe holders 4, so that various devices may be reached via it, as is shown in FIG. 3 and FIG. 4. The movement may be achieved electrically or via rotary unions 9. The mobility is equalized via the universal joints 7, so that the adjustment shafts 6 may remain fixed in place.

All probe holders 4 are moved jointly by a movement of the probe holder plate 3, without the relations between the test probes 8 changing.

The invention claimed is:

1. A prober for testing devices in a repeat structure on a substrate, comprising a probe holder plate, probe holders provided on said plate, a test probe associated with each probe holder, each test probe being displaceable via a manipulator connected to the associated probe holder, and a substrate carrier on which the substrate may be fixed, wherein the probe holder plate is movable in relation to the substrate carrier, the probe holder plate is situated in a vacuum chamber, and displacement wheels of the manipulator of the associated probe holder are connected to rotating universal shafts linked by universal joints, which are led to the outside through a wall of the vacuum chamber in a vacuum-tight way.

2. The prober according to claim 1, wherein the probe holder plate is movable in an X direction running parallel to a surface of the substrate carrier and a Y direction running parallel to the surface of the substrate carrier and perpendicular to the X direction.

3. The prober according to claim 2, wherein the probe holder plate is movable in a Z direction lying perpendicular to the X and Y directions.

4. The prober according to claim 1, wherein the probe holder plate is situated on a cross table.

5. The prober according to claim 1, wherein the manipulator is motor driven.

6. The prober according to claim 1, wherein the substrate carrier is movable in relation to the probe holder plate.

7. The prober according to claim 1, wherein the substrate carrier is connected fixed to a low temperature source.

8. A method for testing devices in a repeat structure on a substrate, comprising: providing the prober of claim 1, positioning test probes of the prober using the manipulator in relation to test contacts on a first device, testing the first device with said prober, and subsequently positioning the test probes in relation to test contacts on a second device, and testing the second device with the prober, wherein the probe holders are moved jointly while maintaining a relation to one another between the testing of the first device and the second device.

9. The method according to claim 8, wherein the probe holders are fastened on the probe holder plate and all probe holders are moved jointly by moving the probe holder plate.

\* \* \* \* \*